United States Patent
Nakatogawa

(10) Patent No.: US 10,997,902 B2
(45) Date of Patent: May 4, 2021

(54) DISPLAY DEVICE

(71) Applicant: Japan Display Inc., Tokyo (JP)

(72) Inventor: Hirondo Nakatogawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 30 days.

(21) Appl. No.: 16/523,225

(22) Filed: Jul. 26, 2019

(65) Prior Publication Data

US 2020/0051495 A1 Feb. 13, 2020

(30) Foreign Application Priority Data

Aug. 8, 2018 (JP) .............................. JP2018-149608

(51) Int. Cl.
*G09G 3/3208* (2016.01)
*H01L 27/32* (2006.01)
*H01L 51/00* (2006.01)
*H01L 51/52* (2006.01)

(52) U.S. Cl.
CPC ....... *G09G 3/3208* (2013.01); *H01L 27/3276* (2013.01); *H01L 51/0097* (2013.01); *G09G 2310/0297* (2013.01); *H01L 51/5237* (2013.01)

(58) Field of Classification Search
CPC .......... G09G 3/3208; G09G 2310/0297; H01L 27/3276; H01L 51/0097; H01L 51/5237
See application file for complete search history.

(56) References Cited

U.S. PATENT DOCUMENTS

| | | | |
|---|---|---|---|
| 9,142,153 B2* | 9/2015 | Park | G02F 1/133305 |
| 9,691,345 B2* | 6/2017 | Park | H01L 27/3244 |
| 10,254,796 B2* | 4/2019 | Isa | G06F 1/1641 |
| 10,481,638 B2* | 11/2019 | Yoshizumi | G06F 1/1626 |
| 10,649,411 B2* | 5/2020 | Cho | G06F 1/163 |
| 10,739,819 B2* | 8/2020 | Arshad | G06F 1/1616 |
| 2006/0092095 A1* | 5/2006 | Ming-Daw | G09G 3/20 345/1.3 |
| 2014/0049449 A1* | 2/2014 | Park | G09G 5/00 345/1.3 |
| 2014/0118221 A1* | 5/2014 | Park | H01L 51/0097 345/1.3 |

(Continued)

FOREIGN PATENT DOCUMENTS

JP 2007-082074 A 3/2007
JP 4852146 B2 1/2012

(Continued)

*Primary Examiner* — Peter D McLoone

(74) *Attorney, Agent, or Firm* — Michael Best & Friedrich LLP

(57) ABSTRACT

A display device includes M number of first signal lines, a first pixel arranged corresponding to each of the M number of first signal lines, N number of second signal lines, a second pixel arranged corresponding to each of the N number of second signal lines (each of M and N is a natural number of 2 or more), a third signal line provided in a first region capable of transforming in response to an external force, and electrically connected to at least any one of the M number of first signal lines, a first connection control circuit electrically connecting the third signal line to any one of the N number of second signal lines, and a drive circuit supplying a signal to the first signal line for driving the second pixel when the third signal line is electrically connected to any one of the second signal lines.

13 Claims, 15 Drawing Sheets

(56) References Cited

U.S. PATENT DOCUMENTS

| | | | | |
|---|---|---|---|---|
| 2017/0082982 A1* | 3/2017 | Cho | ................... | G06F 1/1637 |
| 2017/0139442 A1* | 5/2017 | Yoshizumi | ............ | G06F 1/1641 |
| 2017/0315589 A1* | 11/2017 | Isa | ................... | G06F 1/1641 |
| 2020/0133333 A1* | 4/2020 | Arshad | ............... | H04N 5/2257 |

FOREIGN PATENT DOCUMENTS

| | | |
|---|---|---|
| JP | 2014-022958 A | 2/2014 |
| WO | 2008/129649 A1 | 10/2008 |

* cited by examiner

DISPLAY DEVICE

CROSS REFERENCE TO RELATED APPLICATIONS

This application is based upon and claims the benefit of priority from the prior Japanese Patent Application No. 2018-149608, filed on Aug. 8, 2018, the entire contents of which are incorporated herein by reference.

FIELD

One embodiment of the present invention is related to a display device.

BACKGROUND

A display device including a plurality of display regions has been conventionally proposed (for example, Japanese Laid Open Patent Publication No. 2014-022958, Japanese Laid Open Patent Publication No. 2007-082074, PCT International Publication No. WO2008/129649 or Japanese Patent No. 4852146). According to these display devices, the amount of data that can be presented to a user is increased compared to the case where only one display region is present.

The display devices described in Japanese Laid Open Patent Publication No. 2014-022958, Japanese Laid Open Patent Publication No. 2007-082074, PCT International Publication No. WO2008/129649 or Japanese Patent No. 4852146 include a drive circuit independent for each display region in order to display an image on a plurality of display regions.

SUMMARY

A display device related to one embodiment of the present invention includes M number of first signal lines (M is a natural number of 2 or more), a first pixel arranged corresponding to each of the M number of first signal lines, N number of second signal lines (N is a natural number of 2 or more), a second pixel arranged corresponding to each of the N number of second signal lines, a third signal line provided in a first region capable of transforming in response to an external force, and electrically connected to at least any one of the M number of first signal lines, a first connection control circuit electrically connecting the third signal line to any one of the N number of second signal lines, and a drive circuit supplying a signal to the first signal line for driving the second pixel when the third signal line is electrically connected to any one of the second signal lines.

DESCRIPTION OF EMBODIMENTS

Figure 1:
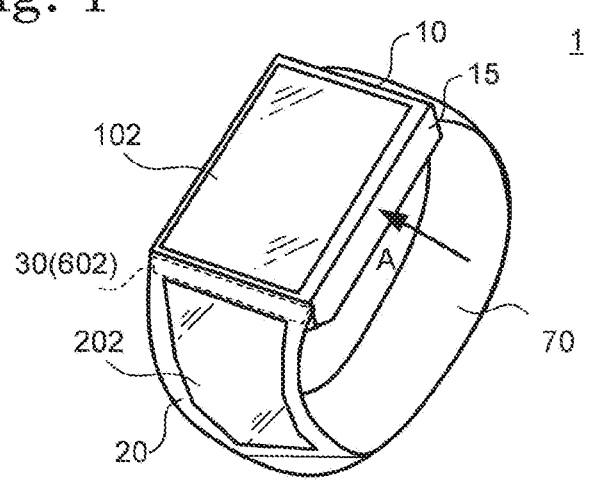
FIG. 1 is a perspective diagram showing an external appearance of a display device related to the first embodiment of the present invention.

Each embodiment of the present invention is explained below while referring to the drawings. Furthermore, the disclosure is merely an example, and a person skilled in the art could easily conceive of appropriate modifications without departing from the gist of the invention and these are naturally contained in the scope of the present invention. In addition, although the drawings may be schematically represented in terms of width, thickness, shape, and the like of each part as compared with their actual mode in order to make explanation clearer, it is only an example and an interpretation of the present invention is not limited.

In addition, in the present specification and each drawing, the same reference numerals are provided to the same elements as those described above with reference to preceding figures and a detailed explanation may be omitted accordingly. Furthermore, characters denoted with [first] and [second] which are attached to each element are convenient signs for distinguishing each element an unless otherwise explained do not have any further meaning.

In addition, in the present t specification, in the case where certain parts or regions are given as [on (or below)] other parts or regions, as long as there is no particular limitation, these include parts which are not only directly on (or directly below) other parts or regions but also in an upper direction (or lower direction). That is, it includes the case where certain parts or regions are given as [on (or below)] other parts or regions, other structural elements may be included between other parts or regions in an upper direction (or lower direction).

Furthermore, in the explanation below, unless otherwise noted, a side which is arranged with display elements with respect to a substrate in a cross-sectional view is explained as [above or on] or [upper surface] and the reverse is referred to as [under or below] or [lower surface].

In addition, in the present specification, unless otherwise made clear, the expressions [α includes A, B or C], [α includes any one of A, B and C] and [α includes one selected from a group comprised from A, B and C] do not exclude the case where a includes a combination of a plurality of A to C. Furthermore, these expressions also do not exclude the case where a includes other elements.

First Embodiment

Figure 2:
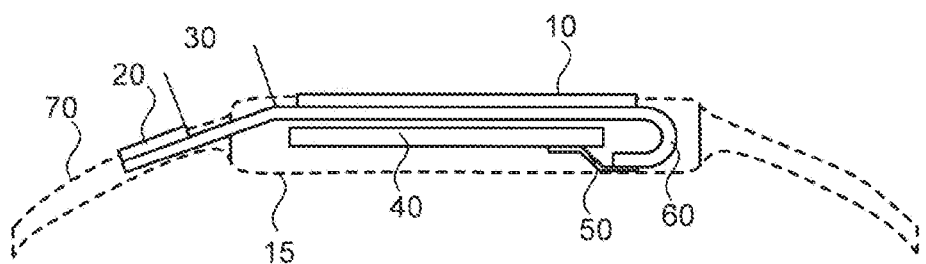
FIG. 2 is a side surface diagram of a display device related to the first embodiment of the present invention.

FIG. 1 is a perspective diagram showing the structure of the external appearance of a display device 1 related to the first embodiment of the present invention. FIG. 2 is a side cross-sectional diagram of the display device 1 seen in the direction of the arrow A in FIG. 1. In FIG. 2, a mounting part 70 and a bezel 15 are shown by broken lines. The display device 1 is a watch type or wristband type display device. The display device 1 includes a first display part 10, a second display part 20, a connection part 30, a control substrate 40, an FPC (Flexible Printed Circuit) 50, a substrate 60, a bezel 15 and a mounting part (belt) 70.

The first display part 10, the second display part 20 and the connection part 30 are formed above the substrate 60. The substrate 60 is, for example, a substrate having flexibility using a resin or the like. In this case, the substrate 60 can be deformed (for example, folded or bent) in response to an external force.

The first display part 10 displays an image (still image or moving image) in the first display region 102. The second display part 20 is a display part different from the first display part 10 and displays an image on a second display region 202. Although, there is a relationship in which the first display part 10 is a main screen and the second display part 20 is a sub screen, the present invention is not limited to this relationship. Although the first display region 102 and the second display region 202 are rectangular regions areas here, they are not limited to this shape.

The connection part 30 includes a plurality of signal lines (signal lines 310 described herein) which electrically connect the first display part 10 and the second display part 20. A first region 602 in which the connection part 30 of the substrate 60 is formed is a non-display region where an image is not displayed. The first region 602 overlaps, for example, a corner of the control substrate 40 or a region of a periphery thereof.

The control substrate 40 is a substrate mounted with a control circuit which controls the display device 1. The control substrate 40 is, for example, a PCB substrate. For example, the control substrate 40 is folded back on the rear surface side of the first display part 10 and is housed inside the bezel 15. The control substrate 40 outputs various signals (for example, timing control signal, control signal and image signal described herein) and a power supply potential.

The FPC 50 is a flexible wiring substrate which physically and electrically connects the control substrate 40 and the substrate 60. One end side of the FPC 50 is connected to the control substrate 40 via a connector (not shown in the diagram), and the other end side is connected to the substrate 60 by pressure bonding or the like. The FPC 50 outputs various signals and a power supply potential which are supplied from the control substrate 40 to the first display part 10 and the second display part 20. The mounting part 70 is a belt shaped member which is formed from a material having flexibility. The mounting part (belt) 70 is mounted by being wound around a user's body part, more specifically, a user's arm (wrist).

Figure 3:
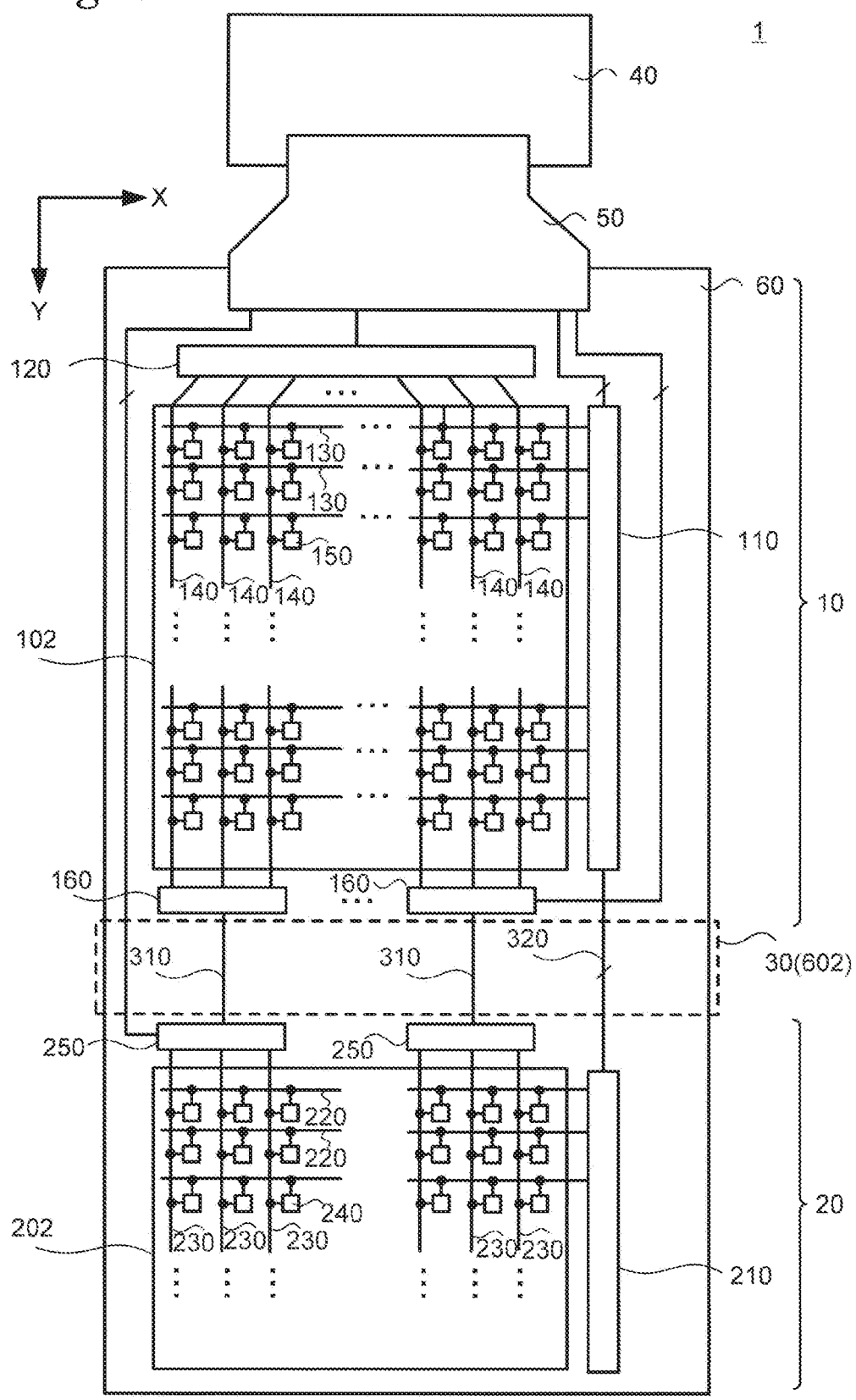
FIG. 3 is a diagram for explaining an electrical structure of a display device related to the first embodiment of the present invention.

FIG. 3 is a diagram for explaining the electrical structure of the display device 1. A diagram in which the substrate 60 is seen from above is shown in FIG. 3. As is shown in FIG. 3, a first direction (here, the short side direction) which is parallel to the upper surface of the substrate 60 is referred to as the [direction X], and a second direction (here, the long side direction) which intersects (here orthogonal) the first direction is referred to as the [direction Y].

The first display part 10 includes a first scanning line drive circuit 110, a data line drive circuit 120, a plurality of first scanning lines 130, a plurality of first data lines 140, a plurality of first pixels 150, a plurality of first display lines and a plurality of multiplexers 160. The first scanning line drive circuit 110, the data line drive circuit 120 and the plurality of multiplexers 160 are electrically connected to the control substrate 40 via signal lines and the FPC 50. Furthermore, FIG. 3 shows only a part of each of the plurality of first scanning lines 130, the plurality of first data lines 140, the plurality of first pixels 150 and the plurality of multiplexers 160.

The first scanning line drive circuit 110 and the data line drive circuit 120 are arranged in the periphery region of the first display region 102. Specifically, the first scanning line drive circuit 110 is arranged in the direction X viewed from the first display region 102 and extends in the direction Y. The data line drive circuit 120 is arranged in a direction opposite to the direction Y viewed from the first display region 102 and extends in the direction X.

The plurality of first scanning lines 130 extend in the direction X in the first display region 102. The plurality of first data lines 140 extend in the direction Y so as to intersect the plurality of first scanning lines 130 in the first display region 102. The first pixel 150 is arranged corresponding to each intersection of the plurality of first scanning lines 130 and the plurality of first data lines 140. A plurality of first pixels 150 are arranged in a matrix in the first display region 102. The first pixel 150 emits light in any one color among red (R), green (G), and blue (B) for example. However, the first pixel 150 may also emit light in other colors. The first scanning line driving circuit 110 selects in sequence the first scanning lines 130 according to a timing signal which is input from the control substrate 40 and supplies a scanning signal to the selected first scanning lines 130. The data line drive circuit 120 selects in a predetermined sequence the plurality of first data lines 140 and supplies an image signal which is input from the control substrate 40 to the selected first data lines 140. Unless otherwise noted, the image signal which is supplied by the data line drive circuit 120 may be either analog or digital.

Figure 4:
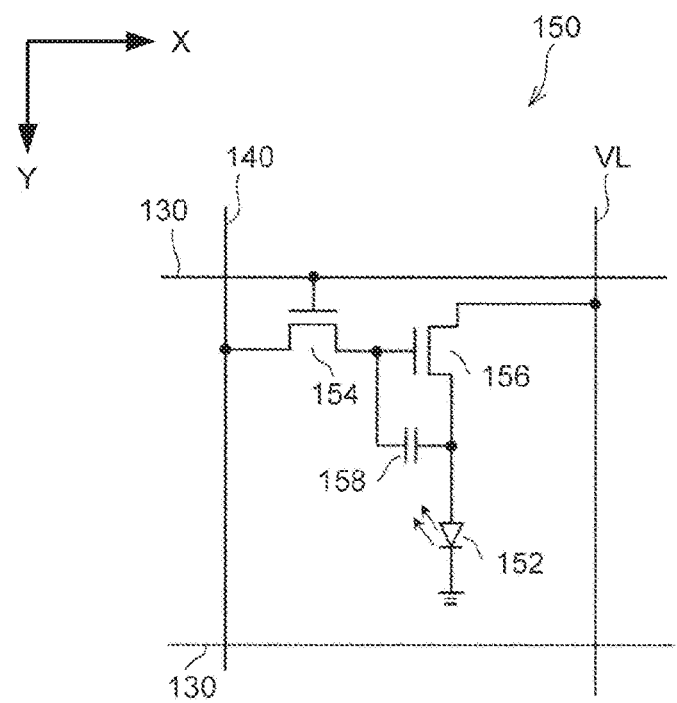
FIG. 4 is a diagram, showing one example of an equivalent circuit such as a pixel related to the first embodiment of the present invention.

FIG. 4 is a diagram showing an example of an equivalent circuit of the first pixel 150. The first pixel 150 includes a light emitting element 152, a pixel TFT (thin-film-transistor) 154, a drive TFT 156 and a storage capacitor 158. The light emitting element 152 includes an organic light emitting diode (OLED). The gate of the pixel TFT 154 is electrically connected to the first scanning line 130. The first scanning line 130 is commonly connected to the gates of a plurality of pixel TFT's 154 which are aligned in the direction X. One of a source or drain of the pixel TFT 154 is electrically connected to the first data line 140, and the other is electrically connected to the gate of the drive TFT 156. The first data line 140 is arranged for each pixel aligned in a vertical direction (pixel column), and is commonly connected to a plurality of pixel TFT's 154 aligned in the pixel column. The type of channel conductivity of the drive TFT 156 is, for example, n-type, the source of the drive TFT 156 is electrically connected to an anode of the light emitting element 152 and the drain is electrically connected to a power supply line VL. The cathode of the light emitting element 152 is formed by an electrode common to all pixels and is fixed to a ground potential or negative potential. A potential which generates a positive voltage between the cathode potential of the light emitting element 152 is applied to the power supply line VL.

Returning to FIG. 3, the multiplexer 160 is arranged corresponding to each of M (M is a natural number of 2 or more) number of first data lines 140 (first signal lines). The multiplexer 160 selectively and electrically connects the M number of first data lines 140 to any one signal line 310 of the connection part 30 in response to a control signal which is input from the control substrate 40. In the present embodiment, M=3. As a result, the number of signal lines 310 in the connection part 30 is ⅓ of the number of first data lines 140 which are included in the first display part 10. That is, the wiring density in the first region 602 is lower than the wiring density in the first display region 102.

The second display part 20 includes a second scanning line drive circuit 210, a plurality of second scanning lines 220, a plurality of second data lines 230, a plurality of second pixels 240 and a plurality of demultiplexers 250. The second scanning line drive circuit 210 is electrically connected to the first scanning line drive circuit 110 via the signal line 320 of the connection part 30. The signal line 320 passes through the first region 602. The plurality of demultiplexers 250 are electrically connected to the control substrate 40 via a signal line and the FPC 50. Furthermore, FIG. 3 shows only a part of each of the plurality of second scanning lines 220, the plurality of second data lines 230, the plurality of second pixels 240 and the plurality of demultiplexers 250.

The second scanning line drive circuit 210 is arranged in the periphery region of the second display region 202. The second scanning line drive circuit 210 is arranged disposed in the direction as seen from the second display region 202 and extends in the direction Y.

The plurality of second scanning lines 220 extend in the direction X in the second display region 202. The plurality of second data lines 230 extend in the direction Y so as to intersect the plurality of second scanning lines 220 in the second display region 202. The second pixel 240 is arranged corresponding to each intersection of the plurality of second scanning lines 220 and the plurality of second data lines 230. A plurality of second pixels 240 are arranged in a matrix in the second display region 202. The structure of the second pixel 240 may be the same as the structure of the first pixel 150.

The second scanning line drive circuit 210 selects the second scanning line 220 at a timing which is different from the first scanning line drive circuit 110. For example, after all the first scanning lines 130 have been selected by the first scanning line drive circuit 110, the second scanning line drive circuit 210 selects a plurality of second scanning lines 220 in sequence, and the selected second scanning line 220 is supplied to a scanning signal. The first scanning line drive circuit 110 outputs a predetermined signal to the signal line 320, for example, at the timing at which all of the first scanning lines 130 are selected. The second scanning line drive circuit 210 begins to select a second scanning line 220 in response to receiving this signal. The image signal which is to be supplied to the second data line 230 is supplied to the second data line 230 via the first data line 140, the multiplexer 160, the signal line 310 and the demultiplexer 250. The method for supplying an image signal to the second data line 230 is described herein.

The demultiplexer 250 is arranged corresponding to each of N number (N is a natural number of 2 or more) of second data lines 230 (second signal lines). The demultiplexer 250 is a first connection control circuit which electrically connects a signal line 310 to the connection part 30 and selectively and electrically connects N number of second data lines 230. In the present embodiment, N=3. As a result, the number of signal lines 310 in the connection part 30 is ⅓ of the number of second data lines 230 which are included in the second display part 20. That is, the wiring density in the first region 602 is lower than the wiring density in the second display region 202.

Figure 5:
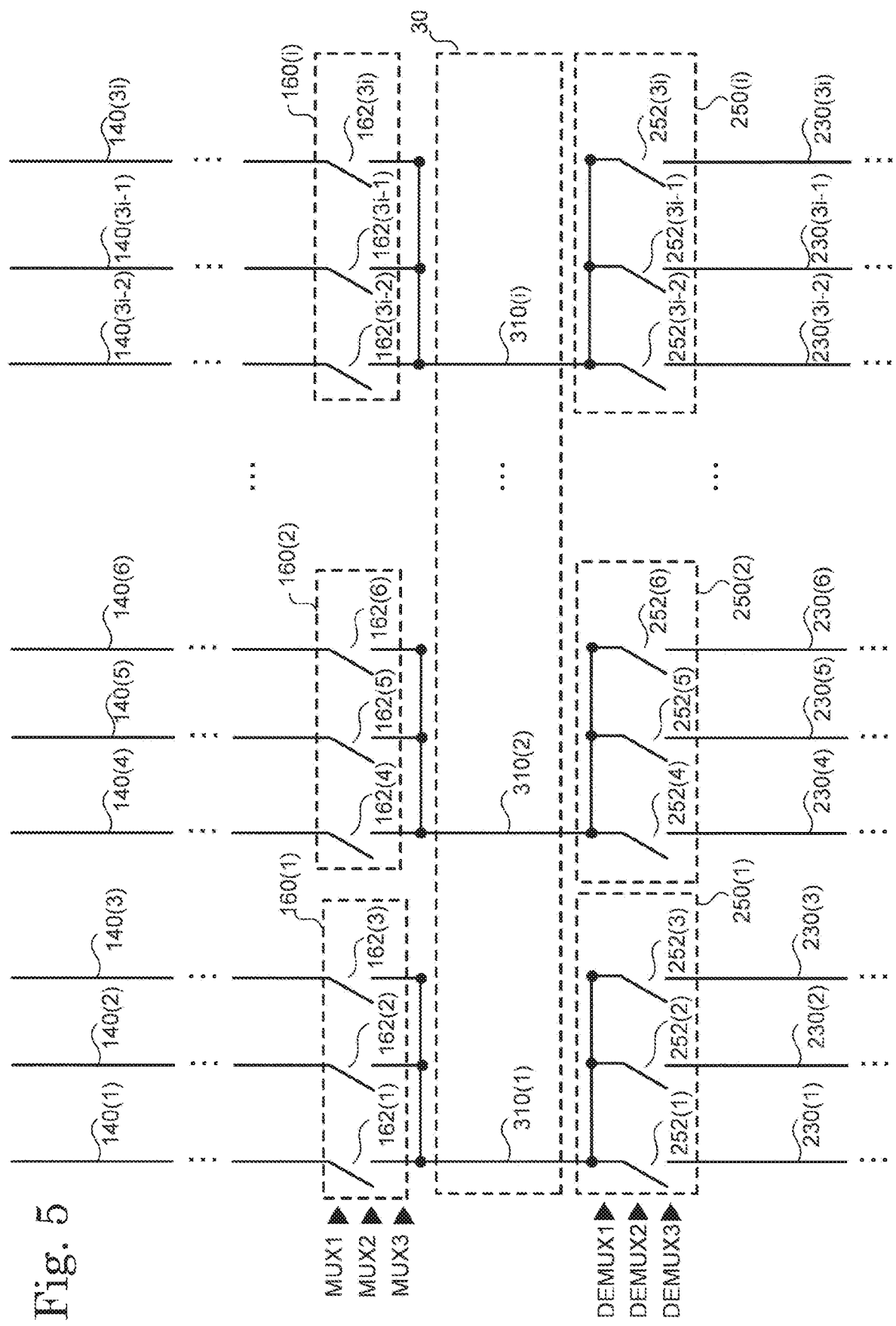
FIG. 5 is a diagram for explaining an electrical connection between a first data line and a second data line related to the first embodiment of the present invention.

FIG. 5 is a diagram for explaining an electrical connection between the first data line 140 and the second data line 230. In the explanation below, in the case when each of the first data line 140, the multiplexer 160, the demultiplexer 250 and the second data line 230 are shown as being located at the i-th position from the left end in the direction Y, [(i)] (i is a natural number) is attached to the end of the reference symbol. A multiplexer 160 (1), multiplexer 160 (2), demultiplexer 250 (1) and demultiplexer 250 (2) are shown in FIG. 5.

The multiplexer 160 (1) includes a switch 162 (1), a switch 162 (2) and a switch 162 (3). One end of the switch 162 (1) is electrically connected to the first data line 140 (1). One end of the switch 162 (2) is electrically connected to the first data line 140 (2). One end of the switch 162 (3) is electrically connected to the first data line 140 (3). The other ends of the switch 162 (1), the switch 162 (2) and the switch 162 (3) are electrically connected to the signal line 310 (1). In addition, the multiplexer 160 (2) includes a switch 162 (4), a switch 162 (5) and a switch 162 (6). One end of the switch 162 (4) is electrically connected to the first data line 140 (4). One end of the switch 162 (5) is electrically connected to the first data line 140 (5). One end of the switch 162 (6) is electrically connected to the first data line 140 (6). The other ends of the switch 162 (4), the switch 162 (5) and the switch 162 (6) are electrically connected to the signal line 310 (2). The switches 162 (1) and 162 (4) are switched on and off in response to a control signal MUX1. The switches 162 (2) and 162 (5) are switched on and off in response to a control signal MUX2. The switches 162 (3) and 162 (6) are switched on and off in response to a control signal MUX3.

Generally, the multiplexer 160 (*i*) includes a switch 162 (3*i*-2), a switch 162 (3*i*-1) and a switch 162 (3*i*). One end of the switch 162 (3*i*-2) is electrically connected to a first data line 140 (3*i*-2). One end of the switch 162 (3*i*-1) is electrically connected to a first data line 140 (3*i*-1). One end of the switch 162 (3*i*) is electrically connected to a first data line 140 (3*i*). The other ends of the switch 162 (3*i*-2), the switch 162 (3*i*-1) and the switch 162 (3*i*) are electrically connected to the signal line 310 (*i*). The switch 162 (3*i*-2) is switched on and off in response to the control signal MUX1. The switch 162 (3*i*-1) is switched on and off in response to the control signal MUX2. The switch 162 (3*i*) is switched on and off in response to the control signal MUX3.

The demultiplexer 250 (*i*) includes a switch 252 (3*i*-2), a switch 252 (3*i*-1) and a switch 252 (3*i*). One end of the switch 252 (3*i*-2), the switch 252 (3*i*-1) and the switch 252 (3*i*) are electrically connected to the signal line 310 (*i*). The other end of the switch 252 (3*i*-2) is electrically connected to the second data line 230 (3*i*-2). The other end of the switch 252 (3*i*-1) is electrically connected to the second data line 230 (3*i*-1). The other end of the switch 252 (3*i*) is electrically connected to the second data line 230 (3*i*). The switch 252 (3*i*-2) is switched on and off in response to a control signal DEMUX1. The switch 252 (3*i*-1) is switched on and off in response to a control signal DEMUX2. The switch 252 (3*i*) is switched on and off in response to a control signal DEMUX3.

Figure 6:
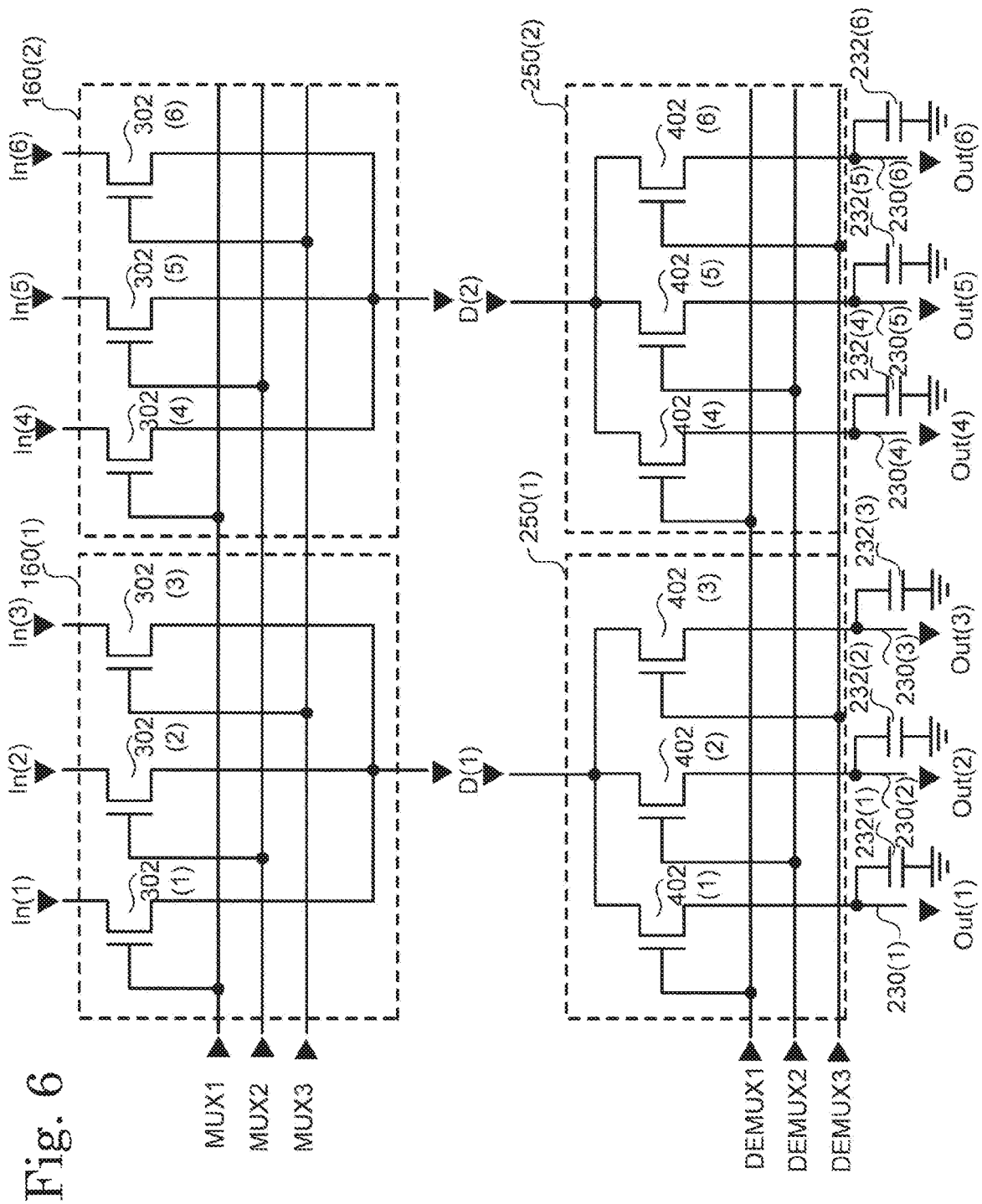
FIG. 6 is a diagram for explaining the transmission of a signal between a first data line and a second data line related to the first embodiment of the present invention.

FIG. 6 is a diagram for explaining the transmission of signals between the first data line 140 and the second data line 230. In FIG. 6, only parts which correspond to i=1 and i=2 among the multiplexer 160 (*i*) and the demultiplexer 250 (*i*) are shown. If a general explanation is given using i, then the switch 162 (*i*) of the multiplexer 160 is formed by an n-channel transistor 302 (*i*). In addition, the switch 252 (*i*) of the demultiplexer 250 is formed by an n-channel transistor 402 (*i*). The gate of each transistor 302 (*i*) corresponds to a control terminal which controls on and off. The control signal MUX1 is input to the gate of the transistor 302 (3*i*-2), the control signal MUX2 is input to the gate of the transistor 302 (3*i*-1), and the control signal MUX3 is input to the gate of the transistor 302 (3*i*) respectively. The transistor 302 (3*i*-2) is switched on when the control signal MUX1 is high, the transistor 302 (3*i*-1) is switched on when the control signal MUX2 is high, and the transistor 302 (3*i*) is switched on when the control signal MUX3 is high.

The image signal In (i) which is supplied to the first data line 140 (*i*) is input to the drain of the transistor 302 (*i*). [Image signal In (i)] shows that it is a data signal to be supplied to the i-th data line. The multiplexer 160 (*i*) supplies any one of the image signals In (3*i*-2), In (3*i*-1) and In (3*i*) to the signal line 310 (*i*). The image signal which is supplied to the signal line 310 (*i*) is [D(i)]. The multiplexer 160 (*i*) is supplied with In (3*i*-2) when the control signal MUX1 is a high level, is supplied with In (3*i*-1) when the control signal MUX2 is a high level, and is supplied with In (3*i*) when the control signal MUX3 is a high level as the signal D(i).

In the demultiplexer 250, the gate of each transistor 402 (*i*) corresponds to a control terminal which controls the on and off of a switch. The control signal DEMUX1 is input to the gate of the transistor 402 (3*i*-2), the control signal DEMUX2 is input to the gate of the transistor 402 (3*i*-1), and the control signal DEMUX3 is input to the gate of the transistor 402 (3*i*) respectively. The transistor 402 (3*i*-2) is switched on when the control signal DEMUX1 is high, the transistor 402 (3*i*-1) is switched on when the control signal DEMUX2 is high, and the transistor 402 (3*i*) is switched on when the control signal DEMUX3 is high.

The image signal D(i) is input from the signal line 310(*i*) to the drain of the transistor 402 (3*i*-2), the drain of the transistor 402 (3*i*-1) and the drain of the transistor 402 (3*i*) of the demultiplexer 250(*i*). Here, the output signal of the transistor 402 (3*i*-2) is Out (3*i*-2), the output signal of the transistor 402 (3*i*-1) is Out (3*i*-1), and the output signal of the transistor 402 (3*i*) is Out (3*i*). In this case, the demultiplexer 250 (*i*) supplies the image signal D(i) to the second data line 230 (3*i*-2) as the output signal Out (3*i*-2) when the control signal DEMUX1 is a high level. The demultiplexer 250 (*i*) supplies the image signal D(i) as the output signal Out (3*i*-1) to the second data line 230 (3*i*-1) when the control signal DEMUX2 is a high level. The demultiplexer 250 (*i*) supplies the image signal D(i) as the output signal Out (3*i*) to the second data line 230 (3*i*) when the control signal DEMUX3 is a high level.

Furthermore, a parasitic capacitor 232 (*i*) is present in the second data line 230 (*i*). The parasitic capacitor 232 (*i*) is equivalent to a capacitor element in which one end is electrically connected to the second data line 230 (*i*) and the other end is connected to ground. The parasitic capacitor 232 (*i*) functions as a holding capacitor which holds an image signal which flows through the second data line 230 (*i*).

Next, display control of the display device 1 is explained. First, display control of the first display part 10 is explained using FIG. 10. Although display control is performed herein when an arbitrary first scanning line 130 is selected, display control is the same when each first scanning line 130 is selected but different when an image signal is different.

In the case when the display of the first display part 10 is controlled, the control substrate 40 sets all of the control signals MUX1, MUX2 and MUX3 and the control signals DEMUX1, DEMUX2 and DEMUX3 to a low level.

Figure 7:
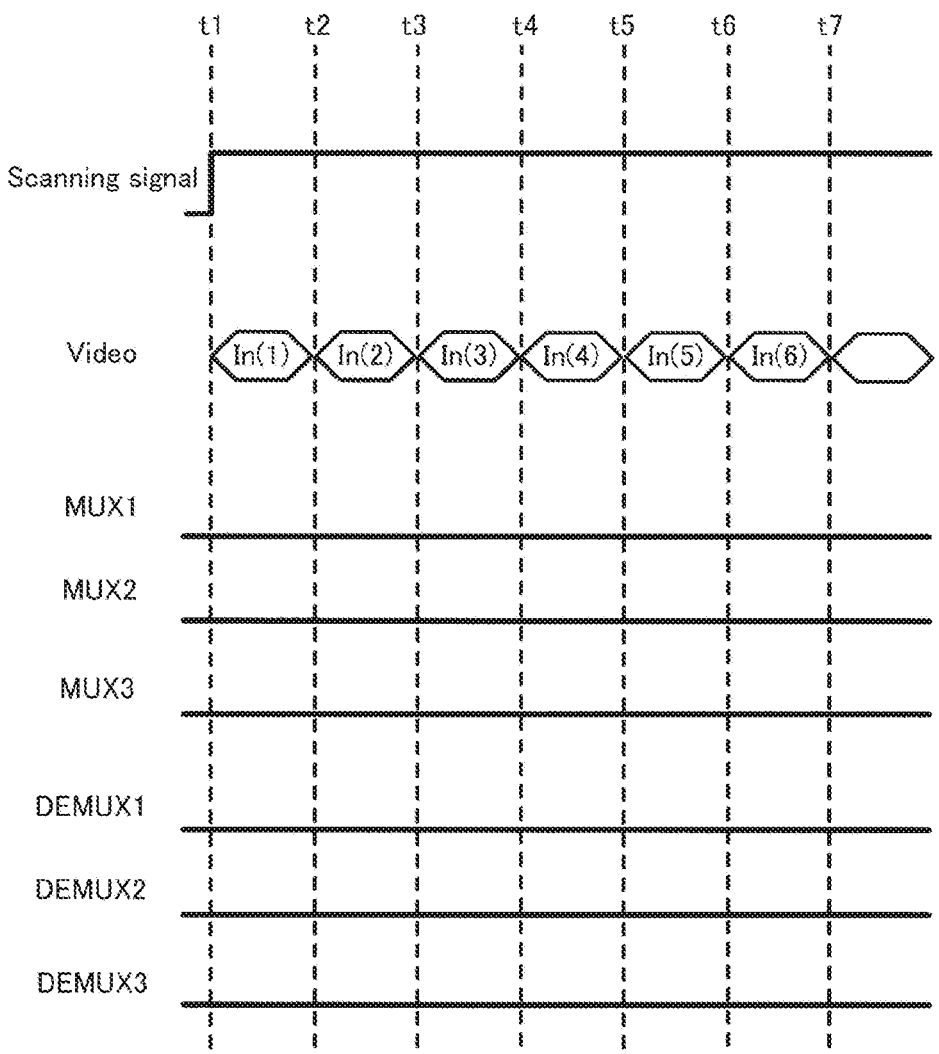
FIG. 7 is a diagram for explaining the control of a first display part related to the first embodiment of the present invention.

Next, the control substrate 40 outputs an image signal for driving each first pixel 150 to the data line drive circuit 120. The data line drive circuit 120 selects first data lines 140 one by one and outputs an image signal. In the example shown in FIG. 7, the data line drive circuit 120 drives the first data lines 140 in sequence, and the image signal In (1) from the time t1 to t2, the image signal In (2) from the time t2 to t3, the image signal In (3) from the time t3 to t4, the image signal In (4) is from the time t4 to t5, the image signal In (5) from the time t5 to t6, and the image signal In (6) from the time t6 to t7 are output. Since all the switches 162 of the multiplexer 160 are switched off, the image signal for controlling the display of the first display part 10 is not supplied to the second display part 20.

Figure 8:
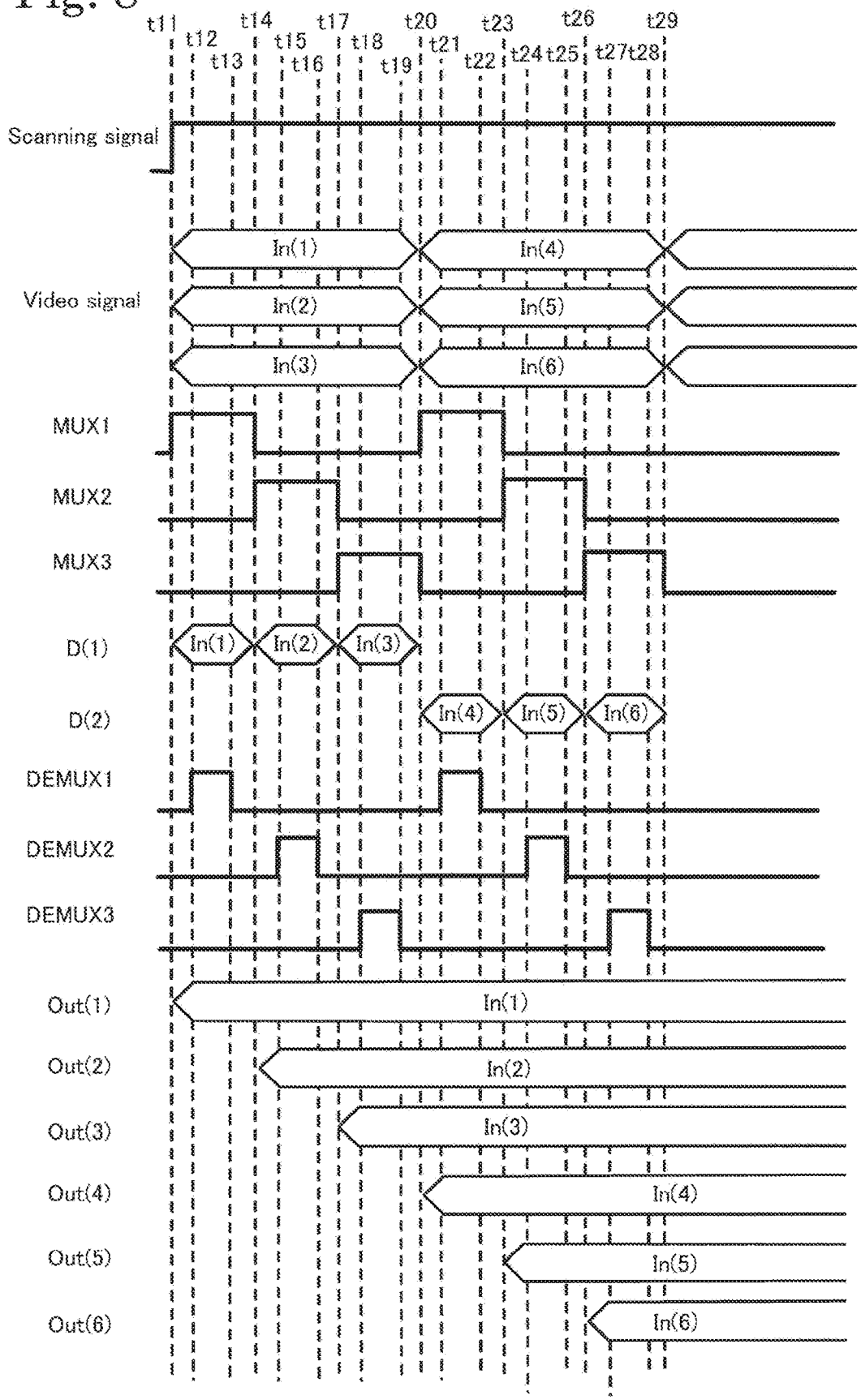
FIG. 8 is a diagram for explaining the control of a second display part related to the first embodiment of the present invention.

Next, display control of the second display part 20 is explained using FIG. 8. Although display control is performed herein when an arbitrary second scanning line 220 is selected, display control is the same when each second scanning line 220 is selected but different when an image signal is different. In addition, before display control starts, the control signals MUX1, MUX2, MUX3 and the control signals DEMUX1, DEMUX2, DEMUX3 are all at a low level.

First, at the time t11, the control substrate 40 outputs an image signal In (1) to the first data line 140 (1), In (2) to the first data line 140 (2) and In (3) to the first data line 140 (3) in parallel in the data line drive circuit 120. In addition, the control substrate 40 switches the control signal MUX1 to a high level. In this case, the multiplexer 160 supplies the image signal In (1) which is supplied via the first data line 140 (1) to the signal line 310 (1) as the image signal D (1). Next, at the time t12, the control substrate 40 switches the control signal DEMUX1 to a high level. In this case, the demultiplexer 250 supplies the image signal D (1) which is supplied from the signal line 310 (1) to the second data line 230 (1) as the output signal Out (1). The output signal Out (1) is held by the parasitic capacitor 232 (1) in parallel with the second data line 230 (1). Next, at the time t13, the control substrate 40 switches the control signal DEMUX1 to a low level.

At the time t14, the control switches 40 switches the control signal MUX2 to a high level. In this case, the multiplexer 160 supplies the image signal In (2) which is supplied via the first data line 140 as the image signal D (1). At the time t15, the control substrate 40 switches the control signal DEMUX2 to a high level. In this case, the demultiplexer 250 supplies the image signal D (1) which is supplied from the signal line 310 (1) to the second data line 230 (2) as the output signal Out (2). The output signal Out (2) is held by the parasitic capacitor 232 (2) in parallel with the second data line 230 (2). Next, at the time t16, the control substrate 40 switches the control signal DEMUX2 to a low level.

At the time t17, the control substrate 40 switches the control signal MUX3 to a high level. In this case, the multiplexer 160 supplies the image signal In (3) which is supplied via the first data line 140 as the image signal D (1). At the time t18, the control substrate 40 switches the control signal DEMUX3 to a high level. In this case, the demultiplexer 250 supplies the image signal D (1) which is supplied from the signal line 310 (1) to the second data line 230 (3) as the output signal Out (3). The output signal Out (3) is held by the parasitic capacitor 232 (3) in parallel with the second data line 230 (3). Next, at the time t19, the control substrate 40 switches the control signal DEMUX3 to a low level.

Next, at the time t20, the control substrate 40 stops the data line drive circuit 120 from outputting the image signals In (1), In (2) and In (3), and to output the signal In (4) to the first data line 140 (4), to output In (5) to the first data line 140 (5) and to output In (6) to the first data line 140 (6) in parallel. In addition, the control substrate 40 switches the control signal MUX1 to a high level. In this case, the multiplexer 160 supplies the image signal In (4) which is supplied via the first data line 140 to the signal line 310 (2) as the image signal D (2). At the time t21, the control substrate 40 switches the control signal DEMUX1 to a high level. In this case, the demultiplexer 250 supplies the image signal D (2) which is supplied from the signal line 310 (2) to the second data line 230 (4) as the output signal Out (4). The output signal Out (4) is held by the parasitic capacitor 232 (4) in parallel with the second data line 230 (4). Next, at the time t22, the control substrate 40 switches the control signal DEMUX1 to a low level.

Next, at the time t23, the control substrate 40 switches the control signal MUX2 to a high level. In this case, the multiplexer 160 supplies the image signal In (5) which is supplied from the data line drive circuit 120 via the first data line 140 to the signal line 310 (2) as the image signal D (2). At the time t24, the control substrate 40 switches the control signal DEMUX2 to a high level. In this case, the demultiplexer 250 supplies the image signal D (2) which is supplied from the signal line 310 (2) to the second data line 230 (5) as the output signal Out (5). The output signal Out (5) is held by the parasitic capacitor 232 (5) in parallel with the second data line 230 (5). Next, at the time t25, the control substrate 40 switches the control signal DEMUX2 to a low level.

Next, at the time t26, the control substrate 40 switches the control signal MUX3 to a high level. In this case, the multiplexer 160 supplies the image signal In (6) which is supplied from the data line drive circuit 120 via the first data line 140 to the signal line 310 (2) as the image signal D (2). At the time t27, the control substrate 40 switches the control signal DEMUX3 to a high level. In this case, the demultiplexer 250 supplies the image signal D (2) which is supplied from the signal line 310 (2) to the second data line 230 (6) as the output signal Out (6). The output signal Out (6) is held by the parasitic capacitor 232 (6) in parallel with the second data line 230 (6). Next, at the time t28, the control substrate 40 switches the control signal DEMUX3 to a low level. At the time t29, the control substrate 40 switches the control signal MUX3 to a low level, and stops the data line drive circuit 120 outputting the image signals In (4), In (5) and In (6).

The control substrate 40 herein also supplies an image signal in parallel to the first data line 140 which is connected to a common multiplexer 160, and performs the display control described above.

According to the first embodiment explained above, the data line drive circuit 120 is shared by the first display part 10 and the second display part 20. In this way, it is possible to expect low costs of the display device compared to the case where an independent data line drive circuit and an FPC are arranged for each display region. In addition, the wiring density in the first region 602 is lower than the wiring density in the first display region 102 and the second display region 202. As a result, even if the display device 1 is deformed at a position where the display device 1 passes through the first region 602, an electrical defect such as a disconnection or a connection failure of the signal line 310 does not easily occur. In addition, since a data line drive circuit is not arranged in a region between the first display region 102 and the second display region 202, it is possible to expect the effect of a narrowing of a non-display region. In this way, it becomes easier to ensure the continuity of a display of the first display region 102 and the second display region 202.

Second Embodiment

Figure 9:
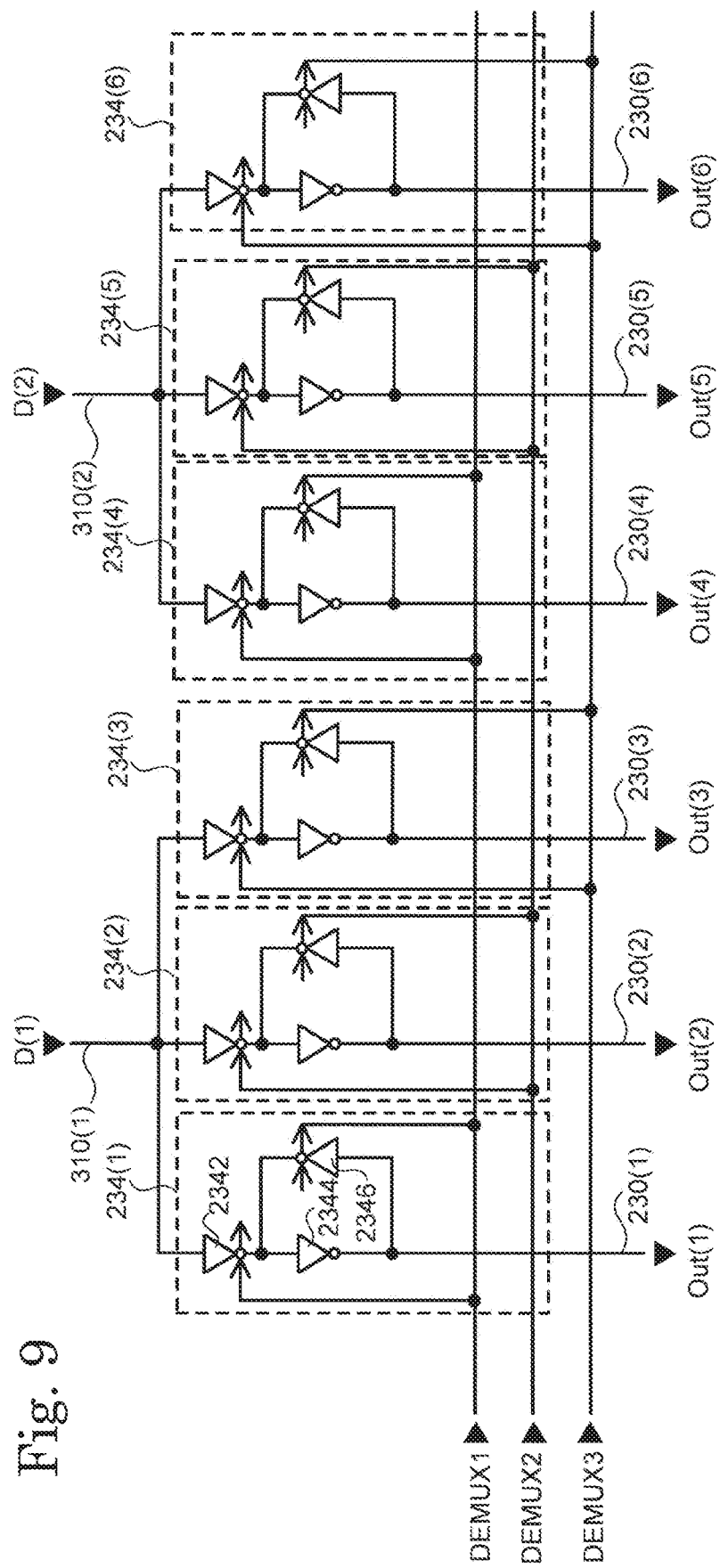
FIG. 9 is a of diagram for explaining the structure of a memory periphery in a display device related to the second embodiment of the present invention.

The display device 1 of the present embodiment includes a memory which holds an image signal supplied to the second data line 230 instead of the demultiplexer 250. FIG. 9 is a diagram for explaining the structure in the memory periphery of the display device related to a modified example of the first embodiment. In this modified example, the image signal which is supplied by the data line drive circuit 120 is a digital format.

A memory which holds a data signal supplied to the second data line 230 ($i$) is called [memory 234 ($i$)]. Only the part which corresponds to i=1 and i=2 in the memory 234 ($i$) is shown in FIG. 9. When a general explanation is given using i, the memory 234 ($i$) is arranged with clocked inverters 2342 and 2346 and an inverter 2344. When DEMUX1 is a high level, the clocked inverter 2342 of the memory 234 (3$i$-2) is switched on and the clocked inverter 2346 is switched off. As a result, the signal line 310 ($i$) and the second data line 230 (3$i$-2) are conducting. On the other hand, since DEMUX2 and DEMUX3 are a low level, the memory 234 (3$i$-1) and the clocked inverter 2342 of the memory 234 (3$i$) are switched off, and the clocked inverter 2346 is switched on. As a result, the signal line 310 ($i$) and each of the second data line 230 (3$i$-1) and the second data line 230 (3$i$) are nonconductive.

When DEMUX1 is a high level, the image signal D(i) is supplied to the second data line 230 (3$i$-2). At this time, the clocked inverter 2346 forms a latch circuit with the inverter 2344. When DEMUX1 is switched to a low level, the clocked inverter 2342 is switched off and the clocked inverter 2346 is switched on. As a result, although the image signal D(i) from the signal line 310 ($i$) is not supplied to the memory 234 (3$i$-2), the held image signal In (3$i$-2) is supplied to the second data line 230 (3$i$-2).

Similarly, when DEMUX2 becomes a high level, the image signal D(i) is supplied to the second data line 230 (3$i$-1) through the memory 234 (3$i$-1). Following this, although the image signal D(i) is not supplied to the memory 234 (3$i$-1) when DEMUX2 is switched to a low level, the held image signal In (3$i$-1) is supplied to the second data line 230 (3$i$-1). When DEMUX3 becomes a high level, the image signal D(i) is supplied to the second data line 230 (3$i$) via the memory 234 (3$i$). Following this, although the image signal D(i) is not supplied to the memory 234 (3$i$) when DEMUX3 is switched to a low level, the held image signal In (3$i$) is supplied to the second data line 230 (3$i$).

As explained above, even in the case when the memory 234 ($i$) is arranged instead of the demultiplexer 250 ($i$), the display device 1 can supply and image signal to the second data line 230 via the first data line 140.

Third Embodiment

Figure 10:
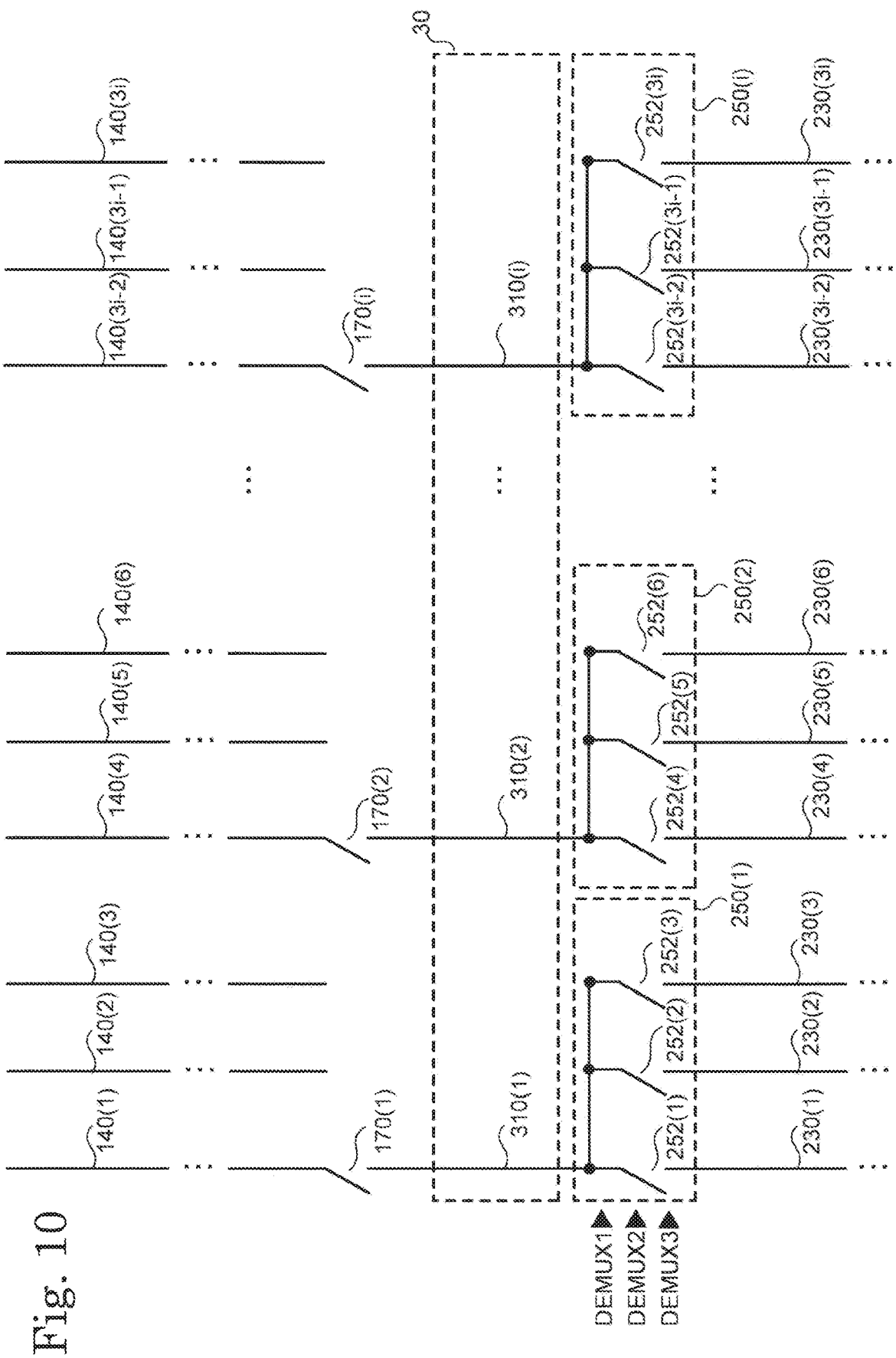
FIG. 10 is a diagram for explaining an electrical connection between a first data line and a second data line related to a third embodiment of the present invention.

The first display part 10 does not need to include the multiplexer 160. FIG. 10 is a diagram for explaining the connection between the first data line 140 and the second data line 230 in the present embodiment. In the present embodiment, instead of the multiplexer 160 (*i*), one of the plurality of first data lines 140 (one in three in FIG. 10) is electrically connected to one end of the switch 170. The other end of the switch 170 is electrically connected to any one of the signal lines 310. Specifically, the first data line 140 (1) is electrically connected to one end of the switch 170 (1), and the other end of the switch 170 (1) is electrically connected to the signal line 310 (1). Here, the first data lines 140 (2) and 140 (3) are not electrically connected to the switch 170. In addition, the first data line 140 (4) is electrically connected to one end of the switch 170 (2), and the other end of the switch 170 (2) is electrically connected to the signal line 310 (2). Here, the first data lines 140 (5) and 140 (6) are not electrically connected to the switch 170. Generally, one end of the switch 170 (*i*) is electrically connected to the first data line 140 (3*i*-2). The other end of the switch 170 (*i*) is electrically connected to the signal line 310 (3*i*-2). On the other hand, the first data line 140 (3*i*-1) and the first data line 140 (3*i*) are not electrically connected to the signal line 310 (*i*).

In the case of controlling the display of the first display part 10, the control substrate 40 switches off all the switches 170 (*i*). In this way, an image signal for driving the first pixel 150 of the first display part 10 is not supplied to the second display part 20.

Figure 11:
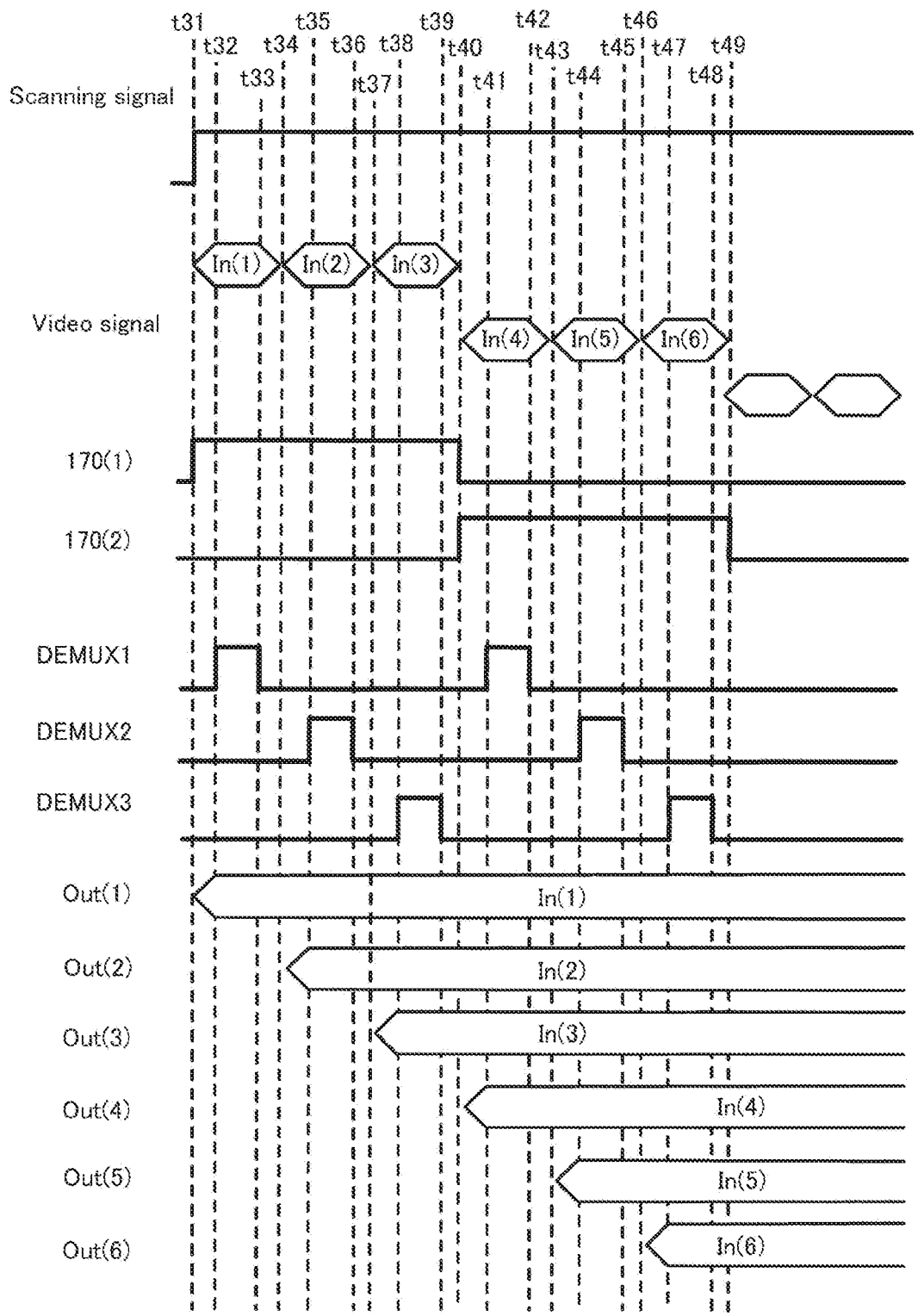
FIG. 11 is a diagram for explaining the control of a second display part related to the third embodiment of the present invention.

Next, display control of the second display part 20 is explained using FIG. 11. First, at the time t31, the control substrate 40 first switches on the switch 170 (1). The control substrate 40 makes the data line drive circuit 120 output the image signal In (1) to the first data line 140 (1). At the time t32, the control substrate 40 switches the control signal DEMUX1 to a high level. In this case, the demultiplexer 250 supplies the image signal In (1) which is supplied from the signal line 310 (1) to the second data line 230 (1) as the output signal Out (1). Next, at the time t33, the control substrate 40 switches the control signal DEMUX1 to a low level.

Next, at the time t34, the control substrate 40 makes the data line drive circuit 120 output the image signal In (2) to the first data line 140 (1). At the time t35, the control substrate 40 switches the control signal DEMUX2 to a high level. In this case, the demultiplexer 250 supplies the image signal In (2) which is supplied from the signal line 310 (1) to the second data line 230 (2) as the output signal Out (2). Next, at the time t36, the control substrate 40 switches the control signal DEMUX2 to a low level.

Next, at the time t37, the control substrate 40 makes the data line drive circuit 120 output the image signal In (3) to the first data line 140 (1). At the time t38, the control substrate 40 switches the control signal DEMUX3 to a high level. In this case, the demultiplexer 250 supplies the image signal In (3) which is supplied from the signal line 310 (1) to the second data line 230 (3) as the output signal Out (3). Next, at the time t39, the control substrate 40 switches the control signal DEMUX3 to a low level.

Next, at the time t40, the control substrate 40 switches off the switch 170 (1) and switches on the switch 170 (2). The control substrate 40 makes the data line drive circuit 120 output the image signal In (4) to the first data line 140 (4). At the time t41, the control substrate 40 switches the control signal DEMUX1 to a high level. In this case, the demultiplexer 250 supplies the image signal In (4) which is supplied from the signal line 310 (2) to the second data line 230 (4) as the output signal Out (4). Next, at the time t42, the control substrate 40 switches the control signal DEMUX1 to a low level.

Next, at the time t43, the control substrate 40 makes the data line drive circuit 120 output the image signal In (5) to the first data line 140 (4). At the time t44, the control substrate 40 switches the control signal DEMUX2 to a high level. In this case, the demultiplexer 250 supplies the image signal In (5) which is supplied from the signal line 310 (2) to the second data line 230 (5) as the output signal Out (5). Next, at the time t45, the control substrate 40 switches the control signal DEMUX2 to a low level.

Next, at the time t46, the control substrate 40 makes the data line drive circuit 120 output the video signal In (6) to the first data line 140 (4). At the time t47, the control substrate 40 switches the control signal DEMUX3 to a high level. In this case, the demultiplexer 250 supplies the video signal In (6) which is supplied from the signal line 310 (2) to the second data line 230 (6) as the output signal Out (6). Next, at the time t48, the control substrate 40 switches the control signal DEMUX3 to a low level. At the time t49, the control substrate 40 switches off the switch 170 (2) and switches on the switch 170 (3).

Following this the control substrate 40 also selects the first data line 140 which is connected to the switch 170 (*i*), and supplies in sequence a data signal which is to be supplied to each of the second data line 230 (3*i*-2), the second data line 230 (3*i*-1) and the second data line 230 (3*i*). In addition, when the display control for one second scanning line 220 is complete, the control substrate 40 selects another second scanning line 220 and performs the display control descried above.

According to the third embodiment explained above, even if the display device 1 does not include the multiplexer 160, the data line driving circuit 120 is shared by the first display region 102 and the second display region 202. In addition to the above, according to the display device of the present embodiment, the same effects as in the first embodiment described above are exhibited. Furthermore, in the third embodiment, although an image video signal is supplied to the second display part 20 via the first data line 140 (3*i*-2), an image signal may also be supplied to the second display part 20 via the first data line 140 the first data line 140 (3*i*-1) or the first data line 140 (3*i*).

Fourth Embodiment

Figure 12:
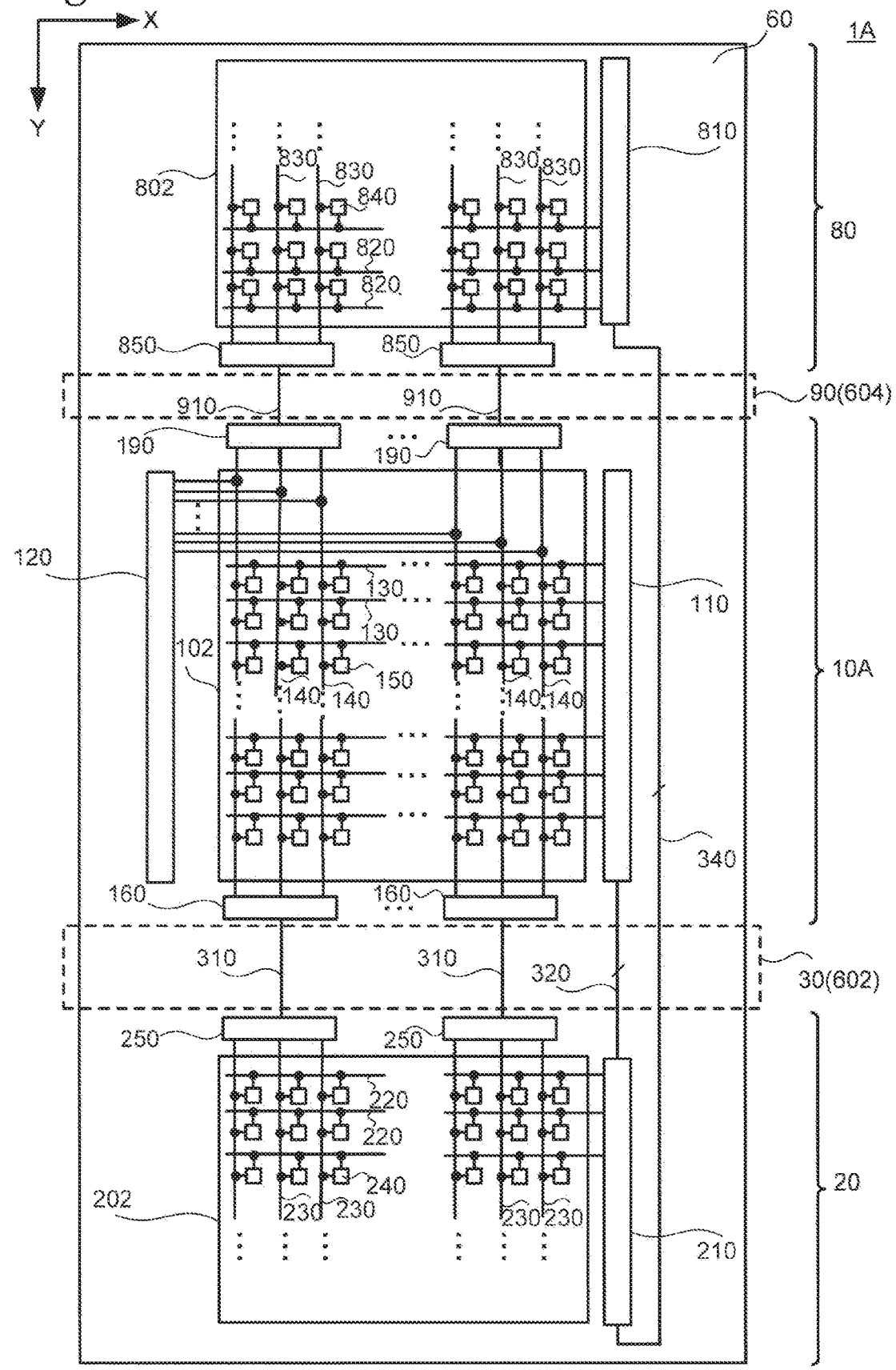
FIG. 12 is a diagram for explaining the electrical structure of a display device related to the fourth embodiment of the present invention.

A display device may have three or more display regions. FIG. 12 is a diagram showing an electrical structure of a display device 1A related to the present embodiment. The display device 1A includes a first display part 10A, a second display part 20 and a third display part 80. The first display part 10A, the second display part 20 and the third display part 80 are formed above a substrate 60. The third display part 80 displays an image in a third display region 802. Furthermore, in order to prevent the diagram from becoming complicated, the control substrate 40, the FPC 50 and the signal lines electrically connected thereto are omitted from FIG. 12.

In the first display part 10A, the other end of the plurality of first data lines 140 on the side where the multiplexer 160 is arranged is electrically connected to the multiplexer 190.

Similar to the multiplexer 160, the multiplexer 190 is arranged corresponding to M number of first data lines 140 (first signal lines). Similar to the multiplexer 160, the multiplexer 190 is formed including M number of switches.

In addition, a second connection part 90 is arranged on the opposite side of the connection part 30 interposed by the first display region 102. The second connection part 90 is formed above the second region 604. Similar to the first region 602, the second region 604 is a region which can deform in response to an external force. The first region 602 and the second region 604 sandwich the first display region 102. The second connection part 90 includes a plurality of signal lines 910 (fifth signal line). The number of signal lines 910 is ⅓ of the number of first data lines 140 which are included in the first display part 10. That is, the wiring density in the second connection part 90 is lower than the wiring density in the first display region 102.

The multiplexer 190 electrically connects the M number of first data lines 140 and any one signal line 910 of the plurality of signal lines 910 which are included in the second connection part 90.

The third display part 80 includes a third scanning line drive circuit 810, a plurality of third scanning lines 820, a plurality of third data lines 830, a plurality of third pixels 840 and a plurality of demultiplexers 850. The functions and connection relationships of each element of the third scanning line drive circuit 810, the plurality of third scanning lines 820, the plurality of third data lines 830, the plurality of third pixels 840 and the plurality of demultiplexers 850 may be the same as the functions and connection relationships of each element of the same name of the second display part 20.

The third scanning line drive circuit 810 selects a third scanning line 820 at a timing which is different from that of the first scanning line drive circuit 110 and the second scanning line drive circuit 210. For example, after all the second scanning lines 220 are selected by the second scanning line drive circuit 210, the third scanning line drive circuit 810 selects a plurality of third scanning lines 820 in sequence and supplies a signal to the selected third scanning line 820. For example, the second scanning line drive circuit 210 outputs a predetermined signal at a timing when all of the second scanning lines 220 are selected via the signal line 340. The third scanning line driving circuit 810 starts to select the third scanning line 820 in response to receiving this signal. In addition, an image signal to be supplied to the third data line 830 of the third display part 80 is supplied via the first data line 140, the multiplexer 190 and the signal line 330 via the demultiplexer 850.

The demultiplexer 850 is arranged for each of L (L is a natural number of 2 or more) number of third data lines 830 (fourth signal lines). The demultiplexer 850 is a second connection control circuit which selectively and electrically connects the signal line 910 of the second connection part 90 to the L number of third data lines 830. In the present embodiment, L=3. As a result, the number of signal lines 910 in the second connection part 90 is ⅓ of the number of third data lines 830 in the third display part 80. That is, the wiring density in the second region 604 is lower than the wiring density in the third display region 802.

When a data signal is supplied to the second display part 20, the control substrate 40 switches off all the switches of the demultiplexer 850 and performs the same driving as in the second embodiment described above. On the other hand, when a data signal is supplied to the third display part 80, the control substrate 40 switches off all the switches of the demultiplexer 250 and may be perform the same driving as the second display part 20. According to this modified example, since three display parts exists, the amount of information that can be presented by the display device is further increased.

Modified Example

The embodiments described above can be applied by combining with each other or replacing each other. In addition, the embodiments described above can be modified and implemented as below.

Figure 13:
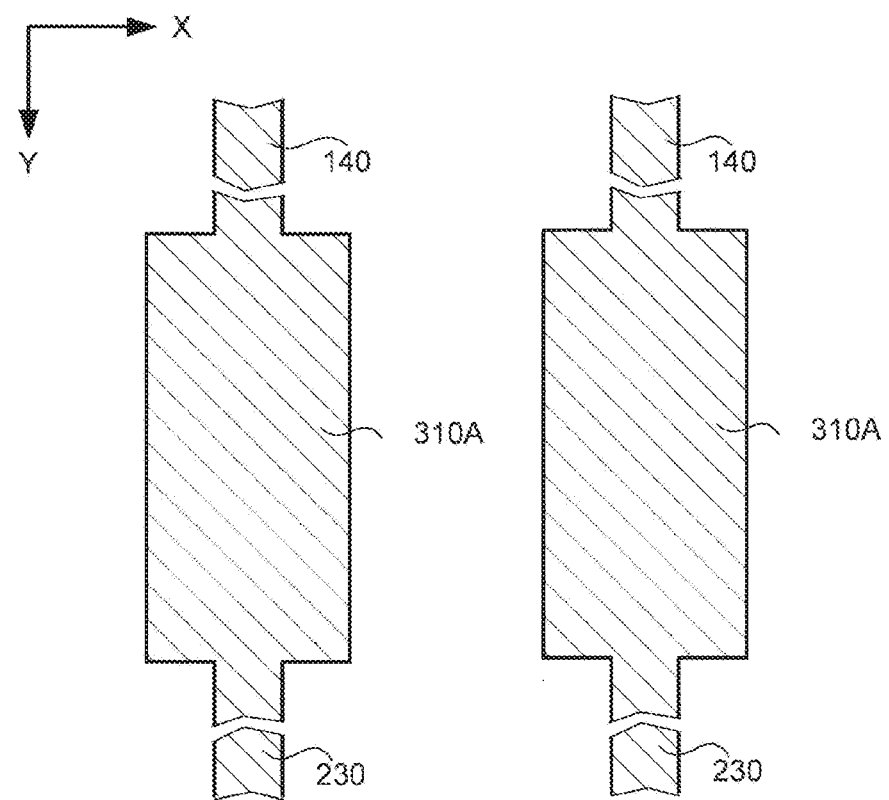
FIG. 13 is a diagram for explaining the structure of a signal line of a connection part related to one modified example of the present invention.

The signal line 310 may be modified as shown below. As is shown in FIG. 13, a signal line 310A which is wider in the direction X than the first data line 140 or the second data line 230 may be used instead of the signal line 310. Since the signal line 310A is wider than the first data line 140 or the second data line 230, the wiring density in the first region 602 is high. Consequently, a disconnection or connection defect in the first region 602 does not easily occur an and electrical failure is less likely to occur.

Figure 14:
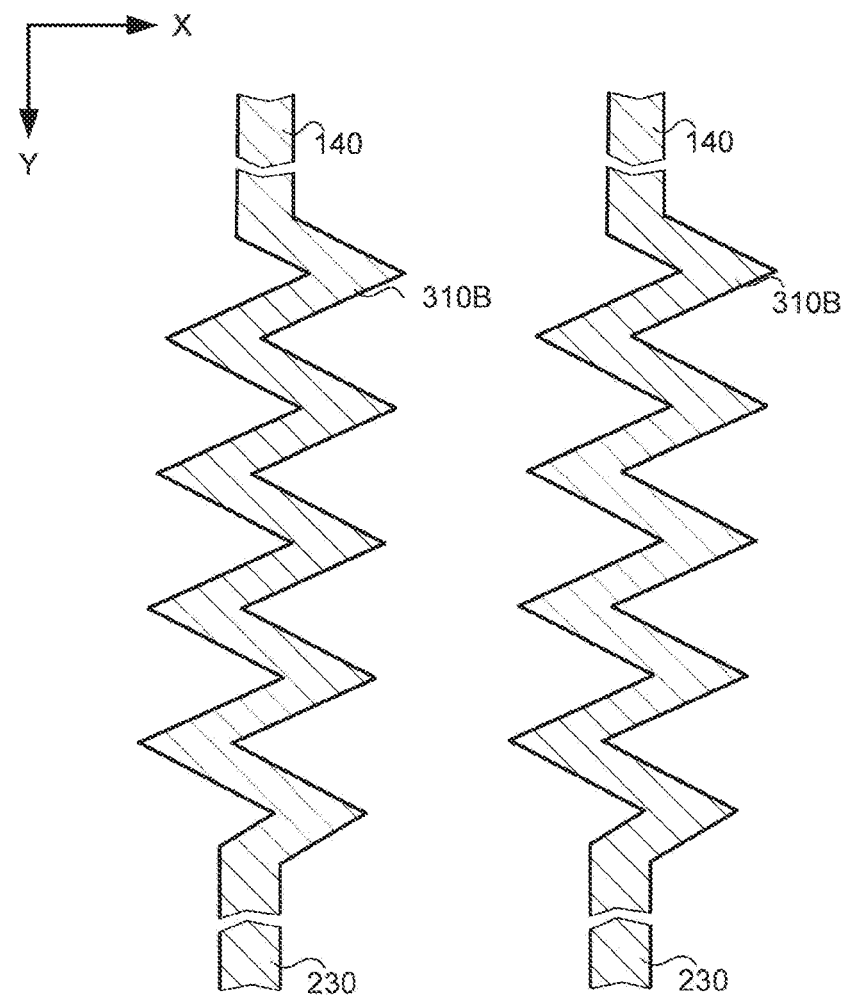
FIG. 14 is a diagram for explaining the structure of a signal line of a connection part related to one modified example of the present invention.

As is shown in FIG. 14, a signal line 310B which longer than the width in the direction Y of the first region 602 may be used instead of the signal line 310. Here, the signal line 3108 includes a plurality of parts which extend in a direction which intersects the direction X and the direction Y. Although the signal line 3108 has a zigzag shape in the example shown in FIG. 14, it is not limited to this structure. According to this modified example, the wiring density in the first region 602 is increased. Consequently, a disconnection or connection defect in the first region 602 does not easily occur an and electrical failure is less likely to occur.

Figure 15:
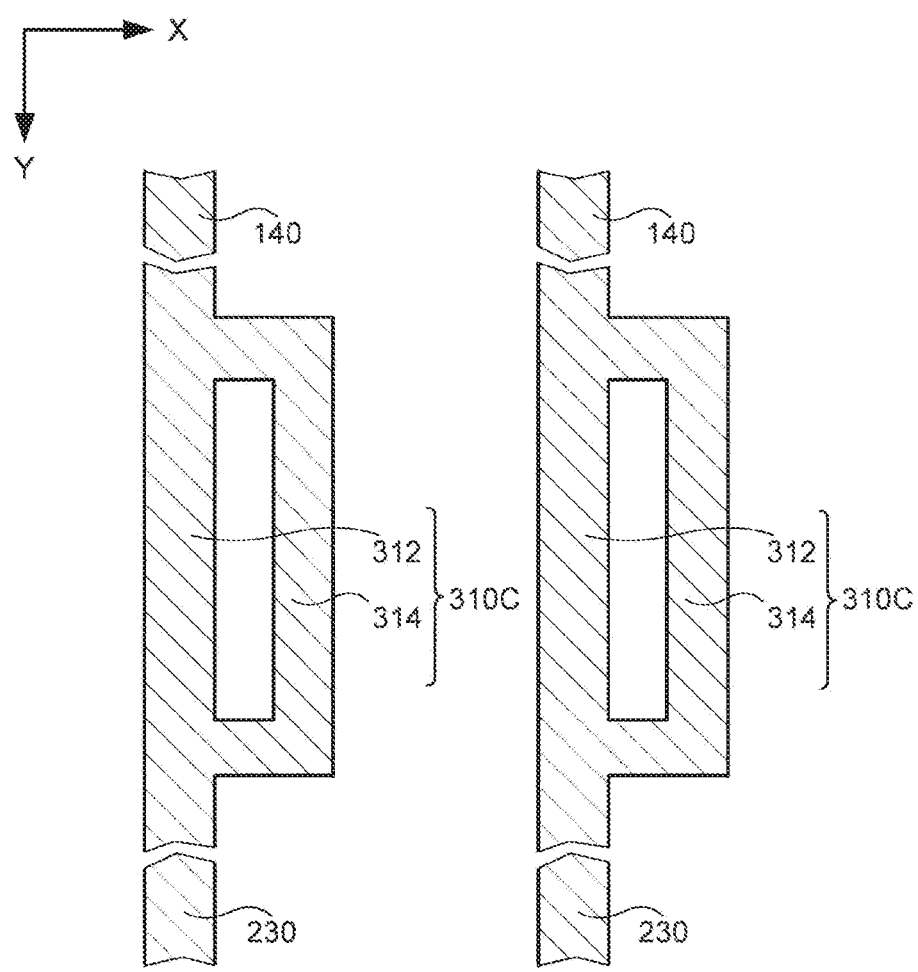
FIG. 15 is a diagram for explaining the structure of a signal line of a connection part related to one modified example of the present invention.

As is shown in FIG. 15, a signal line 310C which has a first part 312 and a second part 314 connected in parallel to the first part 312 may be used instead of the signal line 310. Here, although the first part 312 and the second part 314 have the same width, they are not limited to this structure. According to this modified example, the wiring density in the first region 602 is increased. Consequently, a disconnection or connection defect in the first region 602 does not easily occur an and electrical failure is less likely to occur. Furthermore, the structure of the signal lines explained in FIG. 13 to FIG. 15 can also be applied to the display devices of the second and third embodiments described above.

In the embodiments described above, the case where a single data line drive circuit 120 drives the first data line 140 and the second data line 230 was explained. Instead of this case, a single scan line drive circuit may also be formed to drive the first scanning line 130 and the second scanning line 220. In this case, the first scanning line 130 corresponds to the first signal line of the present disclosure, and the second scanning line 220 corresponds to the second signal line of the present disclosure The display device of the present disclosure does not need to be a watch type or wristband type display device. For example, the display device of the present disclosure may also be a display device which can be folded at the position of the connection part 30. The display device of the present disclosure includes a region which can be deformed according to an external force between the first display region and the second display region, and in this region, it is sufficient that the wiring density is lower than that of the first display region and the second display region.

Although the switch is an n-channel transistor in each of the embodiments described above, it may be a p-channel transistor, an n-channel transistor and a p-channel transistor or some another element. In addition, control signals for turning the switch on or off are different depending on the elements which form the switch.

In addition, although each value of M, N, and L is three in the embodiment described above, it may be two or four or more. In addition, some or all of the values of M, N, and L may be different. In addition, each structure described in the first to fourth embodiments described above may be appropriately combined.

Although the case of an organic EL display device is exemplified as a disclosed example in the embodiments described above, liquid crystal display devices or other self-light emitting type display devices can be given as another application example.

Furthermore, in the category of the concept of the present invention, those skilled in the art could conceive of various examples of changes and modifications and such examples and modifications are to be interpreted as belonging to the scope of the present invention. For example, those skilled in the art could change appropriately add, delete or change the design of constituent elements based on each embodiment described above, or add or omit processes or change conditions as long as it does not depart from the concept of the present invention and such changes are included within the scope of the present invention.

What is claimed is:

1. A display device comprising:
   M number of first signal lines (M is a natural number of 2 or more);
   a first pixel arranged corresponding to each of the M number of first signal lines;
   N number of second signal lines (N is a natural number of 2 or more);
   a second pixel arranged corresponding to each of the N number of second signal lines;
   a third signal line provided in a first region capable of transforming in response to an external force, and electrically connected to at least any one of the M number of first signal lines;
   a first connection control circuit electrically connecting the third signal line to any one of the N number of second signal lines; and
   a drive circuit supplying a signal to the first signal line for driving the second pixel when the third signal line is electrically connected to any one of the second signal lines,
   wherein the first connection control circuit includes a demultiplexer for selectively and electrically connecting the third signal line to the N number of second signal lines.

2. The display device according to claim 1, further comprising:
   a demultiplexer for selectively and electrically connecting the M number of first signal lines to the third signal line.

3. The display device according to claim 1, further comprising:
   a switch for electrically connecting one part of the M number of first signal lines to the third signal line,
   wherein
   the other part of the M number of first signal lines are not connected to the third signal line.

4. The display device according to claim 1, wherein the first connection control circuit includes a memory holding the signal supplied from the third signal line and supplies the signal to the second signal line.

5. The display device according to claim 1, wherein the first region is located between a first display region arranged with the first pixel and a second display region arranged with the second pixel.

6. The display device according to claim 1, wherein the drive circuit supplies a signal to the first signal line for driving the first pixel when the third signal line is not electrically connected to any one of the N number of second signal lines.

7. The display device according to claim 1, further comprising:
   L number of fourth signal lines (L is a natural number of 2 or more);
   a third pixel arranged corresponding to each of the L number of fourth signal lines;
   a fifth signal line provided in a second region capable of transforming in response to an external force, and electrically connected to at least any one of the M number of first signal lines; and
   a second connection control circuit electrically connecting the fifth signal line to any one of the L number of fourth signal lines,
   wherein
   the drive circuit supplies a signal to the first signal line for driving the third pixel when the fifth signal line is electrically connected to any one of the L number of fourth signal lines.

8. The display device according to claim 7, wherein the first region and the second region sandwich a first display region arranged with the first pixel.

9. The display device according to claim 1, wherein the third signal line has a wider width than any one of the M number of first signal lines and the N number of second signal lines.

10. The display device according to claim 1, wherein the third signal line includes a part extending in a direction intersecting the first signal line or the second signal line.

11. The display device according to claim 1, wherein the third signal line includes a first part and a second part connected in parallel to the first part.

12. The display device according to claim 1, wherein the drive circuit outputs an image signal.

13. The display device according to claim 1, further comprising:
   a mounting part for mounting on a member of a user's body.

* * * * *